United States Patent [19]

Liff

[11] 3,835,384

[45] Sept. 10, 1974

[54] TUNING SYSTEM

[75] Inventor: Ronald C. Liff, San Diego, Calif.

[73] Assignee: General Dynamics Corporation, St. Louis, Mo.

[22] Filed: Dec. 20, 1972

[21] Appl. No.: 316,771

[52] U.S. Cl. .................. 325/25, 325/419, 325/453, 325/464

[51] Int. Cl. ........................................ H04b 1/40

[58] Field of Search .............. 325/25, 171, 174–177, 325/184, 455, 464, 458, 383, 452, 465, 468, 419–423; 331/19, 39, 1 A, 51, 8, 18, 22, 34; 250/231 SE; 328/14

[56] References Cited

UNITED STATES PATENTS

| | | | |
|---|---|---|---|
| 2,868,973 | 1/1959 | Jensen et al. | 325/184 |
| 2,914,733 | 11/1959 | Robuck et al. | 331/39 |
| 3,054,057 | 9/1962 | Bettin et al. | 325/383 |
| 3,096,444 | 7/1963 | Seward | 250/231 SE |
| 3,300,731 | 1/1967 | Noyes, Jr. | 331/19 |
| 3,331,035 | 7/1967 | Strickholm | 331/39 |
| 3,372,339 | 3/1968 | Harrison et al. | 331/1 A |
| 3,593,144 | 7/1971 | Coenning | 325/184 |
| 3,597,699 | 8/1971 | Seipel | 331/1 A |
| 3,753,119 | 8/1973 | Close | 325/455 |
| 3,758,853 | 9/1973 | Dionne et al. | 325/455 |

*Primary Examiner*—Benedict V. Safourek
*Assistant Examiner*—Jin F. Ng
*Attorney, Agent, or Firm*—Martin Lu Kacher

[57] ABSTRACT

A radio receiver is described, which is capable of being turned to any frequency in the low through the high frequency bands. A number corresponding to the desired frequency is set into a counter having several decade counter stages each for a separate digit of the frequency. A manually operable control generates pulses at a rate depending upon the speed at which the control is actuated. These pulses are inputted to the first or subsequent stages of the counter depending upon the pulse rate; thus providing automatically and continuously variable tuning rate. The counts stored in the counter are simultaneously applied to a digitally controlled synthesizer and to a digital readout which indicates the frequency to which the receiver is tuned while tuning is being carried out. The output of the digital synthesizer determines the frequency which is received by the receiver which will be accepted by the intermediate frequency stages thereof and thereby controls the tuning of the receiver. The tuning of the receiver may also be preset by applying direct digital inputs simultaneously to each of the counter stages.

32 Claims, 9 Drawing Figures

TUNING SYSTEM

The present invention relates to tuning systems and particularly to radio systems having improved means for tuning.

The invention is especially suitable for use in communications receivers and transmitters and permits such receivers and transmitters to be very rapidly tuned either manually or by computer control to any desired frequency over the very large band of frequencies, which may include several octaves, over which said communications sytems may be operated.

Tuning of communication systems has heretofore been accomplished by mechanical devices or electromechanical devices; thus, gear trains, servo mechanisms including servo motors for operating variable capacitors, inductors and the like have been the conventional method of tuning. Even in modern communication receivers and transmitters, as represented for example by U.S. Pat. No. 3,054,057, individual mechanical or electromechanical controls have been provided to select each digit of the frequency to which the communication receiver is to be tuned.

It is a feature of this invention to eliminate mechanical tuning mechanisms, such as variable components (viz., variable capacitors, inductors, or potentiometers) and yet provide for automatic tuning of networks and entire receivers, transmitters, transceivers and communication systems in an extremely rapid and convenient manner.

It is another feature of this invention to provide a tuning mechanism wherein there is mechanical isolation between the components which are manually operable (e.g., the tuning knob) and the tuned circuits which perform the actual tuning of the networks.

It is also a feature of this invention to provide a tuning system which is continuously controllable to tune over an extremely wide (e.g., multi-octave) frequency band and which displays the frequency to which tuning is accomplished simultaneously while tuning operations are in progress.

Other features and objects of the invention are:

a. to provide an improved control system for tuning a receiver or other tuning network which is digitally controlled;

b. to provide an improved system for tuning which is adapted to be programmed or for manual control;

c. to provide an improved tuning system adapted to either receive manual or computer (programmed) inputs which determine the frequency of tuning;

d. to provide a simplified tuning system where the same system is operative in response to manual (for example, manually generated inputs) or electronic (digital signal) inputs;

e. to provide an improved system for tuning which is highly accurate to high frequency resolutions across an extremely large (multi-octave) tuning range as may be provided in a high frequency receiver;

f. to provide an improved tuning system which automatically provides coarse and fine (band spread) tuning depending upon the desired tuning speed (e.g., the rate of rotation or movement of the tuning knob or dial); and g. to provide an improved system for rapid tuning of radio systems.

Briefly described, a radio system embodying the invention becomes capable of handling signals having any frequency contained in a large band of frequencies, say the entire high frequency band. The system may have a tuning network such, for example as, a synthesizer or local oscillator providing injection signals to a mixer, the output of which either receives or provides inputs to an intermediate frequency selection network having a pass band at a given intermediate frequency; the system being tuned to the frequency which when mixed with the injection frequency, results in the intermediate frequency.

Means are provided for controlling the aforesaid tuning means and includes a plurality of counters connected in cascade to each other. Means are provided for entering counts selectively into the input of different ones of the counters so as to set the counters to counts corresponding to the digits of the desired frequency at different rates. Thus for rapidly tuning, the counts may be entered into the counter for the third digit of the frequency. For somewhat slower tuning the inputs may be entered into the counter for the next lowest order digit, and for fine or band-spread tuning the counts may be entered into the counter for the lowest order digit of the frequency.

Means may be provided for automatically entering the counts into different counters depending upon the rate or speed of tuning. In accordance with an important feature of the invention an opto-electric pulse generator is coupled to a tuning knob or control and produces pulses at a rate depending upon the speed of actuation of the control.

Means are provided responsive to the pulse repetition rate for selectively entering the counts into different ones of the counter stages. Thus, a coarse, fine and band spread tuning may be automatically accomplished merely by the speed at which the tuning control is manually operated.

The foregoing and other objects and advantages of the present invention will become more readily apparent from a reading of the following specification in connection with the accompanying drawings in which:

FIG. 1 is a block diagram of a radio receiver system which embodies the invention;

FIGS. 2A, 2B, and 2C are respectively a perspective view, a schematic diagram, a waveform diagram, all showing the pulse generator used in the system of FIG. 1 and explaining its mode of operation;

Figure 1:
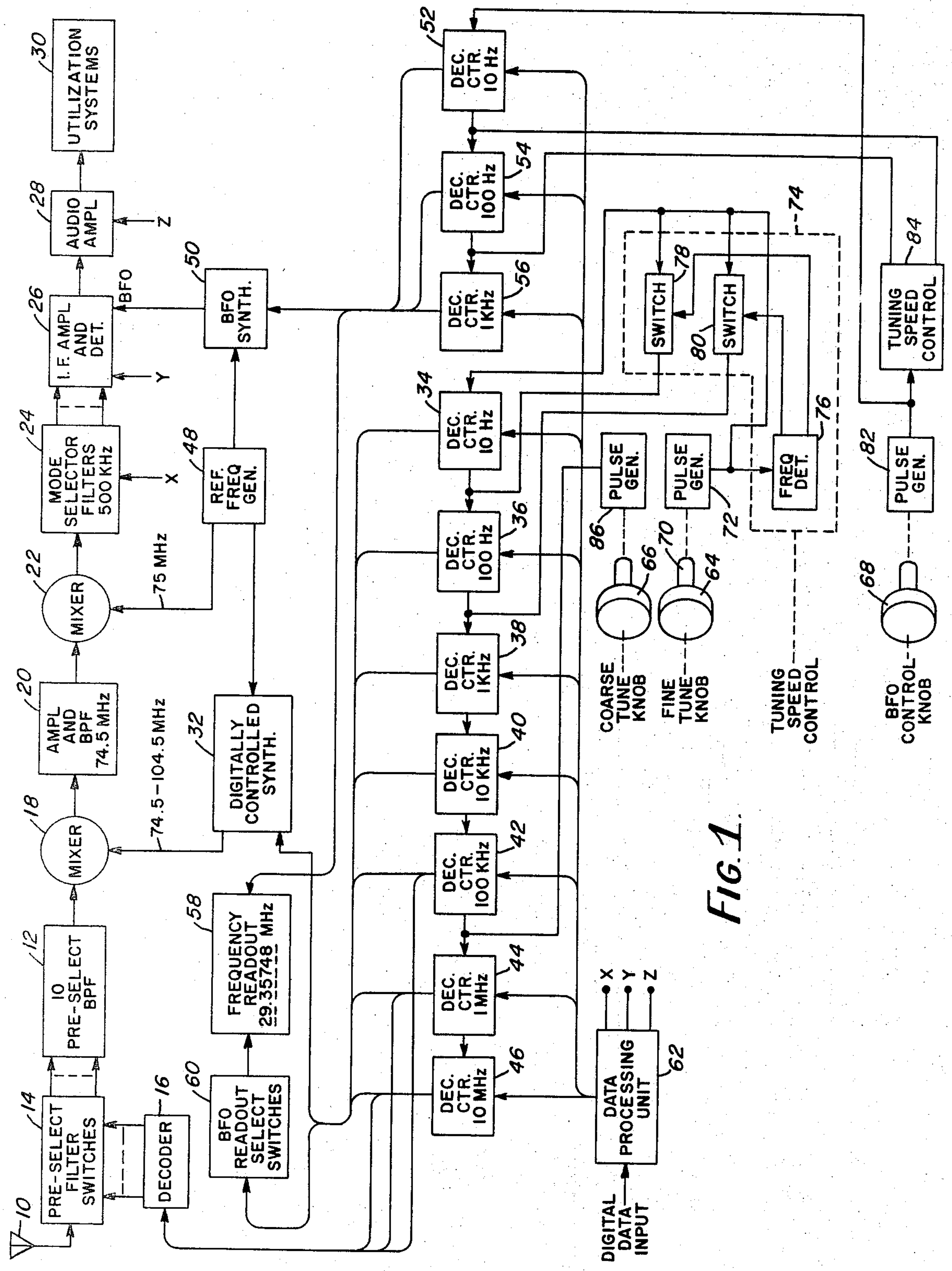

Referring to FIG. 1. There is shown a receiver which is capable of being tuned to any frequency up to 30 MHz. While the receiver is illustrated, it would be appreciated that the invention may be used in transmitters, transceivers, and other communication systems and networks, and otherwise for tuning purposes. The signals to be handled by the system may be received on an antenna 10. In order to increase the selectivity of the system, preselect bandpass filters 12 may be connected to the antenna through filter switches 14. Switches may be provided on the output as well as the input side of the filters 12, as shown, for greater isolation. A decoder 16 which is operated by the tuning system included in the receiver selects one of ten of the filters 12, which encompasses in its bandpass the frequency to which the receiver is tuned.

A mixer 18 serves to translate the frequency passed by the selected one of the filters 12 to a first intermediate frequency. A first intermediate frequency amplifier and bandpass filter 20 passes the signal on to a second mixer 22 which thereupon translates the signal to the second intermediate frequency. The first intermediate frequency is indicated as being 74.5 MHz, and the second intermediate frequency is indicated as being 500 KHz. In the event that the receiver is to handle various types of signals, such as amplitude modulated (AM) signals, frequency modulated (FM), continuous wave (CW), and single sideband signals (independent lower or upper sidebands), mode selector filters 24 are used so as to pass a band centered at 500 KHz which will include signals having the selected mode of modulation (AM, CW, FM), or the sidebands (USB, LSB, or ISB). The output of the mode selector filter is applied to intermediate frequency amplifiers and detector circuits 26. Preferably there are two channels of intermediate frequency amplifier and detector circuits, one for single sideband and FM signals, and the other for AM and CW signals. The output of the detectors 26 are applied to audio amplifiers 28 which amplify the detector signals to sufficient level to operate utilization systems 30, such as loud speakers, headphones, teletypewriters, and other display devices, depending on the nature of the signals. Control over the selection of the desired mode selector filter, IF and detector channel and utilization system, is provided by means of code lines X, Y, and Z, which are connected to the mode selector filter bank 24, the IF and detector channels 26 and the audio amplifier 28.

In order to tune the receiver, an injection signal is generated and applied to the first mixer 18 by a digitally controlled synthesizer 32. This synthesizer provides injection signals at any frequency 10Hz apart from 74.5 to 104.5 MHz in the receiver system described herein for purposes of explaining the invention. The digitally controlled synthesizer 32 will be described in detail hereinafter in connection with FIGS. 6A and B. The synthesizer serves to tune the receiver to a frequency determined by the frequency of the injection signal which it provides to the mixer 18. Such tuning is provided since the output of the mixer 18 will be within the bandpass (74.5 MHz) of the first intermediate frequency amplifier and bandpass filters 20 when the signal to be handled, which is applied to the input terminal of the mixer 18, when subtracted from the injection frequency from the synthesizer 32, equals 74.5 MHz. Thus, for example, in order to tune the receiver to receive input signals having a frequency of 29.35748 MHz, the injection signal from the digitally controlled synthesizer 32 must be 103.85748 MHz. Control of the digitally controlled synthesizer achieves this tuning to the selected frequency. Such control is provided by a chain of decade counters 34, 36, 38, 40, 42, 44, and 46. The counts from these counters is inputted to the synthesizer 32 and serves to preset similar counters in the synthesizer. As will be discussed more fully in connection with FIGS. 6A and B, these synthesizer counters are contained in phase-locked loops controlled by reference frequencies from a reference frequency generator 48. Thus, the correct selected frequency to the accuracy of the reference frequency generator 48.

The reference frequency generator 48 also provides the 75 MHz injection frequency to the second mixer 22. When the first intermediate frequency from the amplifiers and bandpass filters 20 is subtracted from this injection frequency in the mixer 22, the second intermediate frequency of 500 KHz is produced. Simultaneously, a reference frequency is applied to another synthesizer indicated as the BFO or beat frequency oscillator synthesizer 50. This synthesizer may be a phase locked loop synthesizer having decade counters controlled by a chain of decade counters 52, 54, and 56 in the tuning control of the receiver. The count in these decade counters serves to translate the injection frequency or BFO injection to the detectors 26 and serves to re-inject the carrier into these detectors which may be of the synchronous type, the carriers having an offset of up to 10 KHz (10 Hz to 9,990 Hz), so as to beat with the selected CW or single sideband signal and to produce audio frequency product for amplification in the audio amplifiers 28. The exact frequency of the BFO signal is obtained in the BFO synthesizer 50 which is also locked to the accuracy of the reference frequency generator 48 but is controlled to provide the desired frequency offset by tuning controls including the counter stages 52, 54, and 56.

The decade counters 34 to 46 in the main tuning control and the counters 52 to 56 in the BFO tuning control are connected to a frequency readout or display 58. This display may be a numeric display whereby numerals, one for each digit of the frequency, are created from illuminated segments. The segments being selected in accordance with the count in the decimal counter for that numeral. The BFO frequency may utilize three of the display numerals, say the last three for the three lowest order digits, by operating BFO readout select switches 60 which then connect the counters 52, 54, and 56 to the display for the last three digits.

Tuning control is obtained by presetting the decade counters. Such presetting may be accomplished by a digital data input signal from a computer keyboard or the like which is applied to a data processing unit which may be part of the keyboard and translates the code representing the selective frequency (which may be an ASCII or binary code for example) into preset and address signals as well as control signals X, Y and Z. The various counter stages for the main tuning control (34 to 46) and the BFO tuning control 52 to 56 may thereby be preset. When the counter stages 42, 44, and 46 for the highest order digits are set they provide outputs also to the decoder 16 for the preselect filter switches 14 and serve to select the proper preselect filter (viz., the filter which contains the selected frequency within its bandpass).

Tuning control may be provided manually by means of tuning knobs. Three knobs 64, 66 and 68 are provided for fine, coarse and BFO tuning. As will become more apparent hereinafter, only a single knob, the fine tuned knob 64, is really necessary to tune rapidly over the entire band. In the event that BFO signals are not used, the BFO control knob 68 may be dispensed with and the entire receiver tuned with a single knob.

The shaft 70 of the fine tune knob 64 is connected to a pulse generator 72. This generator produces a train of pulses while the knob is rotated, the pulses having a repetition rate dependent upon the rate or speed of rotation of the knob 64. An embodiment of the pulse generator which will be described in detail hereinafter in connection with FIG. 2, includes an opto-electric transducer which produces a train of pulses by interrupting a light beam whenever the knob 64 is rotated. These pulses are applied to a tuning speed control system 74. This system detects the repetition rate or frequency of the pulses and serves to connect or apply the pulses to the inputs of different ones of the counters depending upon the magnitude of the repetition rate (viz., the speed of rotation of the knob 64). The tuning speed control 74 may include a frequency detector 76. The pulses from the pulse generator 72 are applied to the first or lowest order decade counter 34 which is at one end of the main counter chain. It will be noted that a decade counter is provided for each of the digits of the frequency which may be selected, the counter 34 providing counts corresponding to the 10 Hz digit of the frequency; the counter 36 for the 100 Hz digit; the counter 38 for the 1 KHz digit; the counter 40 for the 10 KHz digit; the counter 42 for the 100 KHz digit; the counter 44 for the 1 MHz digit; and the counter 46 for the 10 MHz digit. By applying the pulses to the 10 Hz counter, 10 pulses are required before a single pulse is applied to the 100 Hz counter. A thousand pulses are required before a single pulse is applied to the 1 KHz counter. Accordingly, by switching the input pulses to the input of the 100 KHz counter, the counting rate will increase tenfold, and by applying the pulses to the input of the 1 KHz counter, the counting rate will increase a hundredfold. Accordingly, the frequency detector 76 detects the pulse repetition rate or pulse frequency which of course corresponds to the speed at which the knob is rotated. When the speed reaches a first threshold, the switch 78 is closed and the pulses are applied to the 100 Hz counter 36. If the speed continues to increase and reaches a second threshold, another switch 80 is closed and the pulses are applied to the input of the 1 KHz counter. Thus, in the high speed case, the pulses are applied to the 1 KHz counter; the entire frequency range of tuning may be covered very rapidly, for example, 1 MHz of tuning may be covered in a few seconds. Nevertheless, by turning the knob 64 slowly, pulses are applied only to the input of the 10 Hz counter and extremely fine band-spread tuning can be accomplished.

A similar pulse generator 82 and tuning speed control 84 is connected to the BFO control knob 68. The tuning speed control 84 causes the BFO pulse generator 82 to switch to the input of the 100 Hz or 1 KHz BFO decade counter 54 and 56, depending upon the speed of rotation of the BFO control knob 68. In this manner the rate of BFO tuning can easily be adjusted and BFO tuning to the exact BFO frequency rapidly accomplished.

For extremely fast coarse tuning a pulse generator 86 similar to the other pulse generator 72 and 82 may be connected to the coarse tune knob 66. This pulse generator provides pulses directly to the input of the 1 MHz decade counter 44. In the event that the pulse generator 86 is an opto-electric generator, it may have a coarser resolution, a wider area light interrupting means, so as to provide say 30 pulses for each rotation of the coarse tune knob. A rotation of the coarse tune knob then produces 30 pulses and covers the entire frequency range (0 to 30 MHz) in one rotation of the knob. The frequency is displayed continously while tuning. Thus, the control of the receiver and tuning may be rapidly and accurately accomplished. The numbers flash by rapidly on the screen until the higher order digits become stationary, then the rotation of the knob being used is slowed until the lower order digits successively become stationary, then the knob is stopped and the receiver is tuned to the exact frequency displayed on the frequency readout 58.

Figure 2C:
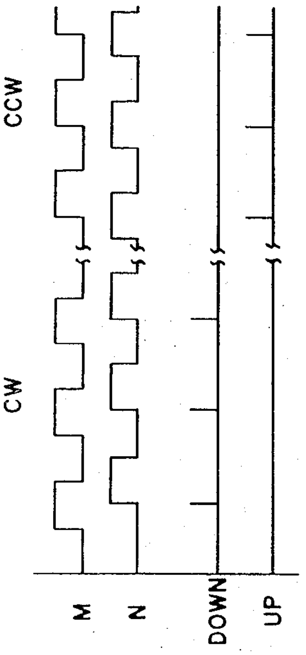
Figure 2A:
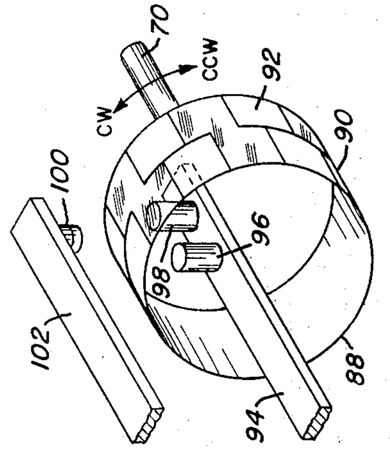
Figure 2B:
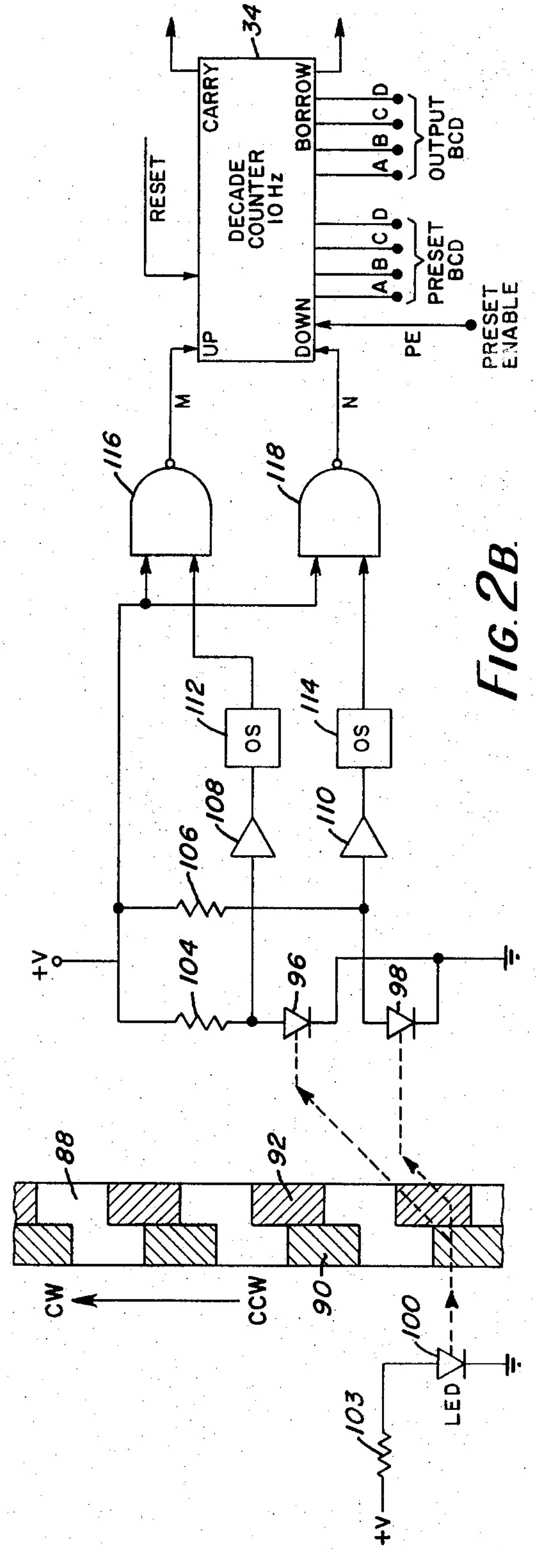

The pulse generator 72 and the circuitry connected thereto for interfacing with the first decade counter stage 34 are all illustrated in FIGS. 2A and 2B. The shaft 70 of the knob 64 is connected to rotate a cylinder 88 having two tracks 90 and 92 of successive alternate transparent and opaque areas. Carried on a beam 94 which extends into the cylinder 88 are two light detector diodes 96 and 98. Each diode is closely adjacent to different ones of the tracks 90 and 92 and only is illuminated when light passes through the transparent areas of its respective track. For providing the illumination, a light-emitting diode 100 is mounted on a beam 102 in juxtaposition to the detector diodes 96 and 98 on the outside of the cylinder 88. As the knob and shaft 70 rotate, the light is interrupted and the conductivity of the light detector diode increased or decreased depending upon whether they are adjacent to transparent or opaque areas of their respective tracks 90 and 92. The faster the shaft is rotated the more rapidly the conductivity changes.

This conductivity change is converted into electrical pulses by the circuitry shown in FIG. 2(B). Consider for example, a desired number of opaque and transparent areas on each of the tracks 90 and 92. There may be, for example, 120 opaque areas on each track, or one opaque area for each 3° of rotation of the shaft 70 and cylinder 88. A pulse is then produced for each 3° of rotation of the shaft. For tuning knobs of convenient size, say 2 inches in diameter, three revolutions per second (RPS) is about the maximum tuning rate, thus pulses at a rate of 360 pulses per second may be produced. By applying such pulses to the input of the 1 KHz counter 38 (see FIG. 1), 360 KHz of frequency may be covered in one second, thus, in the event that high speed tuning is desired 1 MHz may be covered is less than 5 seconds. Nevertheless, when the fine tune knob is rotated slowly a single pulse is produced for a 3° rotation. Thus by moving the knob 64 3°, the frequency can be changed 10 Hz. It will therefore be apparent that both very rapid and yet very accurate high resolution tuning may be accomplished through the use of the invention.

Returning to FIG. 2B, a layout of the tracks 90 and 92 of the cylinder 88 illustrates that the adjacent opaque and transparent areas of the tracks are in overlapping relation. As shown, these tracks are in approximately 50 percent overlapping relation. Thus, the detector diodes 96 and 98 will be illuminated in sequence depending upon the direction of rotation of the shaft 70. For clockwise illumination the diode 96 becomes illuminated first, then the diode 98. For counter clockwise rotation the diode 98 is illuminated first followed by the diode 96. The light emitting diode 100 is on continuously, being supplied with operating voltage from the source indicated at +V through a resistor 103.

When the diodes 96 or 98 are illuminated, current flows from an operating voltage source indicated at +V through different resistors 104 and 106, the diodes 96 and 98, to ground. The voltage drop across the resistors due to such current flow is amplified in amplifiers 108 and 110 which serve to trigger one-shot multi-vibrators 112 and 114. As shown in FIG. 2C, the outputs of the multi-vibrators are square waves of given duration, say approximately one-tenth millisecond duration, which are applied to NAND gates 116 and 118, which set the logic levels for operating the first or 10 Hz decade counter stage 34. This decade counter stage, like the other decade counter stages, may be commercially-available integrated circuit components; the micro-circuit identified by the designation 4029A which is manufactured by Radio Corporation of America (RCA), Summerville, N.J., is suitable. This counter has up and down inputs, re-set inputs, a carry output, and a borrow input. Also, when a preset enable input is applied to a preset enable (PE) input, the counter may be set in accordance with the count represented by code levels in BCD-binary coded decimal-form on four preset BCD lines, A, B, C and D. The output BCD lines, also indicated as A, B, C, and D, will be at levels depending upon the count stored in the counter (viz., the number of pulses applied to the up lines, less the number of pulses applied to the down line). It will be noted that the counter can not count below zero or above 10. When a count of 10 is reached, the counter recycles to zero and provides a pulse on the carry line. When the counter counts down into zero, it provides a pulse on the borrow line which goes to the next higher order decade counter stage and resets itself to a count of 10. The counter resolves the direction ambiguity because both output lines M and N to the up and down input terminals of the counter must be in the high logic state in order for a count to be entered. The counter changes state by the first or leading pulse setting the counter and the lagging pulse entering the count. Thus, for motion in a clockwise direction, the impulse from the gate 116 sets the counter but the counter only enters a pulse on the leading edge of the N pulse. Thus, where the shaft is turned in a clockwise direction the counter will count down. Conversely, N pulses lead M pulses for counter clockwise rotation. The N pulses set the counter and the M pulses enter the count on the up line. The counter then counts up when the shaft is rotated in a counter clockwise direction.

The pulses and their sequence of occurrence are shown in FIG. 2C which also illustrates how the sequence of the pulses at the output of the gates 116 and 118 provides for the entering of up and down counts, depending upon the counter-clockwise or clockwise rotation of the shaft 70.

Figure 3:
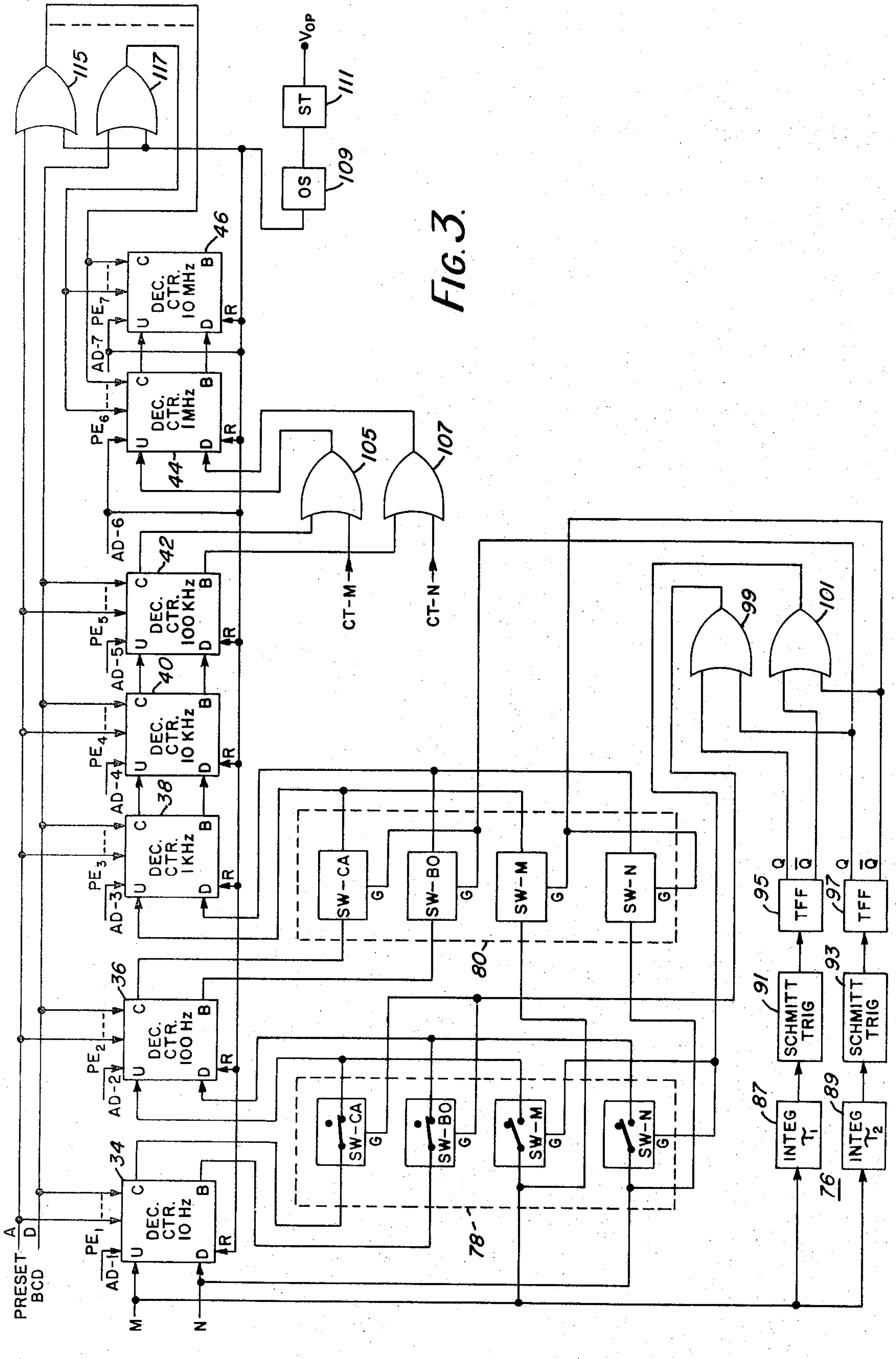
FIG. 3 is a block diagram illustrating the counter chain and tuning speed control system used in the receiver shown in FIG. 1.

FIG. 3 illustrates the tuning speed control as well as the programming and reset of the counters 34 and 46. Each of the counters 34 to 46 of the tuning control is shown in FIG. 3. However, the output lines for the binary coded decimal words representing the numerals 0 to 9 which are stored in each counter stage, are not shown to simplify the illustration. The pulse input lines M and N are applied to the up and down input terminals of the lowest order or 10 Hz counter stage 34 as was illustrated in FIG. 2B. One of these lines, the M line for example, is connected to the frequency detector 76. Two frequency detector channels are provided which are similar to each other, each channel is constituted of an integrator 87 and 89, a Schmitt trigger circuit (ST) 91 and 93 connected to the output of the integrator, and a triggerable flip-flop (TFF) 95 and 97 connected to the output of the Schmitt triggers. The integrators may be integrated circuit amplifiers having feedback networks which establish integration time constants $\tau_1$ in the case of the integrator 87, and $\tau_2$ in the case of the integrator 89. When the pulse is applied to the integrators 87 and 89 they are integrated therein and the output of the integrators represents the time interval of these pulses. Accordingly, should the pulses occur at greater than a first rate, the output of the integrator 87 which has a shorter integration time constant $\tau_1$ than the integrator 89, will reach a threshold level sufficiently high to trigger the Schmitt trigger circuit 91. A positive going leading edge of the Schmitt trigger output waveform is operative to trigger the flip-flop 95 which becomes re-set such that its $\bar{Q}$ output assumes a level requisite for operating switches SW-M and SW-N in the first switch 78. Similarly, the Q output of the flip-flop 95 assumes the complementary or opposite logic state which causes switches SW-CA and SW-BO in the switch 78 to drop out or open. The switch operating levels from the flip-flop 95 and from the other flip-flop 97 of the frequency detector 76 are applied to the switches 78 to an OR gate 99. The switches are indicated as single pole — double thrown switches operated by a control potential applied to an input thereof indicated with the G. These switches may be solid state integrated circuit switches. Four switch units are contained in a single package. The integrated circuit switch type 4016A manufactured by the Radio Corporation of America, Summerville, New Jersey, is suitable. The input lines M and N are disconnected when the flip-flop 95 is triggered, which in turn results from the frequency or repetition rate of the pulses being greater than a first magnitude, through the switches SW-M and SW-N to the input of the second highest order to 100 Hz decade counter stage 36. The other switches SW-CA and SW-BO, being open, the carry and borrow outputs of the first counter stage 34 are disconnected from the up and down inputs to the second counter stage. It may be desirable to omit the disconnection of the carry and borrow outputs of the 10 Hz and 100 Hz counter stages 34 and 36. It will be recalled that the output lines of each counter stage are connected to the frequency readout 58 without the inter-connection as is caused when the switches SW-CA and SW-BO open, and would permit the last count or slowly varying counts to remain displayed. Allowing the progression of counting to continue as though there were no speed control makes the readout more normal and pleasing.

When the repetition rate of the pulses (viz., the speed of tuning) increases still further, the integrated output level of the second integrator 89 reaches the threshold for triggering the Schmitt trigger 93. The Schmitt trigger 93 will again trigger the flip-flop 97. The $\bar{Q}$ outputs then are passed through the OR gate 101 to insure that the first switch stage 78 will remain operated as was the case when the first pulse repetition rate was exceeded. The OR gates 99 and 101 may be omitted if desired in order to simplify and lower the cost of the system. The Q and $\bar{Q}$ outputs of the flip-flop 97 are applied to switches SW-CA, SW-BO, SW-M, and SW-N of the second switch 80. These switches operate in the manner identical to that described above for the first switch 78. The SW-CA and SW-BO switches serve to disconnect the 100 Hz counter carry and borrow outputs from the up and down inputs of the 1 KHz counter. The M and N inputs are applied to the SC-M and SW-N switches of the switch 80 directly to the up and down inputs of the 1 KHz counter. As soon as the frequency repetition rate of the pulses on the M and N lines drops below the threshold, the Schmitt triggers 91 and 93 output levels drop below the triggering level of the flip-flops 95 and 97 and the flip-flops assume their initial condition with the Q outputs in the high switch operating state and the $\bar{Q}$ outputs in the low state which allows the switches SW-M and SW-N of the switch stages 78 and 80 to remain open. The system thus provides automatic electronic gear shift under the control of the tuning rate (viz., the rate at which the tune control knob 54 is rotated).

The coarse tune control knob provides two inputs CT-M and CT-N through OR gates 105 and 107, which are connected between the carry and up and the borrow and down inputs of the 100 KHz counter 42 and the 1 MHz counter 44. Accordingly, when coarse tune pulses from the pulse generator 86 (FIG. 1) are provided, the pulses pass through the OR gates 105 and 107 and directly increment or decrement the 1 MHz counter 44.

It is desirable that the counters all be re-set in the event of a failure of operating voltage $V_{op}$, or when the ON/OFF switch of the receiver is turned off. In that event, a Schmitt trigger 111, which is normally at a high level when the operating power is applied, drops to a low level, the negative excursion causes a one-shot multivibrator 109 to trigger. The pulse from the one-shot multivibrator is applied to the re-set input of each of the counter stages 34 through 46. Simultaneously, this pulse from the one-shot is applied to OR gates 115 and 117 to the 1 MHz and 10 MHz counter stages 44 and 46. The reset pulse is simultaneously applied to the preset enabled terminals $PE_6$ and $PE_7$ of these counter stages 44 and 46. The outputs of the OR gates are applied to certain of the pre-set BCD lines of the counter stages 44 and 46 and pre-set these stages to some desired intermediate count, say a count of 9 for the 1 MHz counter 44, and a count of 1 for the decade counter 46. This count will then automatically set these counters to the approximate center of the band so as to reduce the tuning time when the receiver is again placed into operation.

Pre-set BCD and address information is applied to the preset BCD terminals and the address input terminals $PE_1$ to $PE_7$ of the counters along lines AD-1 to AD-7. The data processing unit 62 (FIG. 1) thus provides seven successive preset words, each including a preset enable bit and for BCD bits. A succession of these seven words, generated sequentially by the processing unit will address each of the counters 34 to 46 remotely to the exact frequency of tuning which may be desired when manual tuning control is not used.

Figure 4:
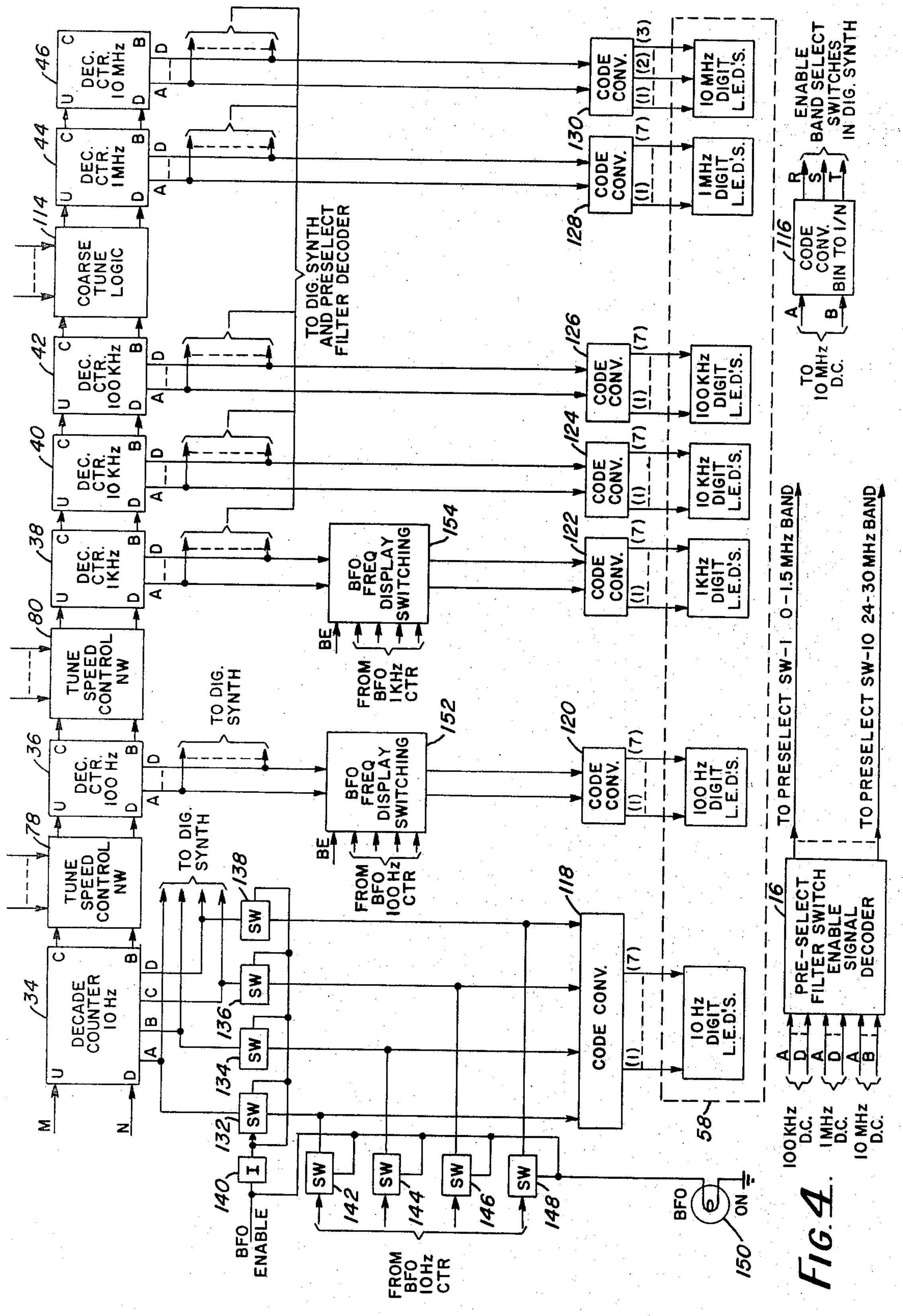
FIG. 4 is a block diagram illustrating the counter shown in FIG. 3, together with the readout display and other digital elements coupled to the counter.

Referring to FIG. 4, the chain of counter stages 34 to 46 is illustrated in a simplified manner to show the tuning speed control network switching 78 and 80 between the 10 Hz and 100 Hz counter stages 34 and between the 100 Hz and 1 KHz counter stages 36 and 38. The coarse tuning logic 114 consisting of the OR gates 105 and 107 (FIG. 3) are similarly inserted between the 100 KHz and 1 MHz decade counter stages 42 and 44.

FIG. 4 illustrates how the BCD output terminals of each of the counter stages is coupled to the digital preselect filter decoder 16 and BFO counter stages 52 to 56.

The output lines A to D on which the count stored or registered in the counter stages appears, are connected to different stages of the digital synthesizer. It will be noted that the highest order decade counter stage 46 is connected to a code converter 116 which may be included in the digital frequency synthesizer. Inasmuch as the highest frequency in this illustrative example does not exceed 30 MHz, only the first two of the BCD output lines, Line A and Line B, are converted to the input of the code converter which produces, depending upon the numbers stored in the 10 MHz counter 46, output levels on three different output lines R, S and T. The output line R is at a high logic level when a count of zero is stored in the 10 MHz counter stage 46 (corresponding to tuning from 0 to 9.99999 MHz). The next 10 MHz of tuning occurs when a count of 1 is stored in the 10 MHz counter 46, then an output level is produced on the S line. The final 10 MHz of the tuning range is covered when an output pulse appears on the T line corresponding to a count of 2 in the 10 MHz counter 46.

The BCD output lines from the last three counter stages 42, 44, and 46, are connected to the input of the preselect filter decoder which serves to enable the preselect filter switches. In this illustrative receiver there are 10 preselect filter switches, SW-1 to SW-10, which cover successive increments of the frequency range. As shown in FIG. 4, the first and last of the preselect filters cover the frequency range from 0 to 1.5 MHz, respectively. The decoder is therefore a BCD to one out of N decoder for selecting only one of the ten lines which enable the preselect switches 14, which is set by the decoder at a switch operating logic level.

The frequency readout 58 includes 10 light emitting diode segment displays. In such displays there are seven elements out of which all of the digits may be constructed from 0 to 9. Code converters are provided for operating each of the light emitting diodes, depending upon a binary coded decimal input, the code converters 118, 120, 122, 124, 126, 128 and 130 of a BCD to seven bit code converters. These converters are commercially available, either separately or as part of a light emitting diode digit display package. The 10 KHz, 100 KHz, 1 MHz and 10 MHz counter stages 40 to 46 have their BCD outputs connected directly to the code converters 124, 126, 128 and 130 for operating the light emitting diode digit displays. The 10 Hz, 100 Hz, and 1 KHz counter stages 34, 36 and 38 are connected to the code converters through beat frequency oscillator frequency display select switches 60. There are three groups of such switches 60. They are connected between the 10 Hz counter 34 and the code converter 118, the 100 Hz counter 36 and the code converter 120, and finally between the code converter 122 and the 1 KHz counter 38.

These beat frequency display switches are similar networks. The network for the 10 Hz counter includes an integrated circuit containing four switches, similar to the integrated circuits shown in the tuning speed control networks 78 and 80 (FIG. 3). Four of these switches, 132, 134, 136 and 138 (suitably part of the same integrated circuit switch package) are normally in the closed position having switched operating logic level continuously applied thereto when a BFO enabled level is not present. An inverter 140 provides operating levels for closing the switches 132 to 138 when the BFO enabled level is not present. Then the outputs of the decade counter 34 are applied directly to the code converter 118 and the lowest order digit representing the frequency elected is displayed. When a BFO enabled level is applied, four more of these switches 142, 144, 146, and 148 are operated and connect the BCD inputs from the 10 Hz BFO decade counter stage 52 to the code converter 118. Simultaneously, the switch operating levels to the switches 132 to 138 disappear and these switches open so as to disconnect the frequency select decade counter 34 from the code converter 118. The BFO frequency is then displayed. In order to alert the operator than a BFO frequency is displayed in the 10 Hz, 100 Hz, and 1 KHz counter stages, the BFO enable line is applied to a BFO ON-lamp 150 which illuminates when the BFO enable level is present. BFO frequency display switching networks 152 and 154 which connects the 100 Hz and 1 KHz BFO decade counter stages 54 and 56 or the decade counter stages 36 and 38 to the code converters 120 and 122 for display upon occurrence of the BFO enable (BE) signal, are also provided and operate in the same manner as the switching devices 132 to 138 and 142 to 148.

Figure 5:
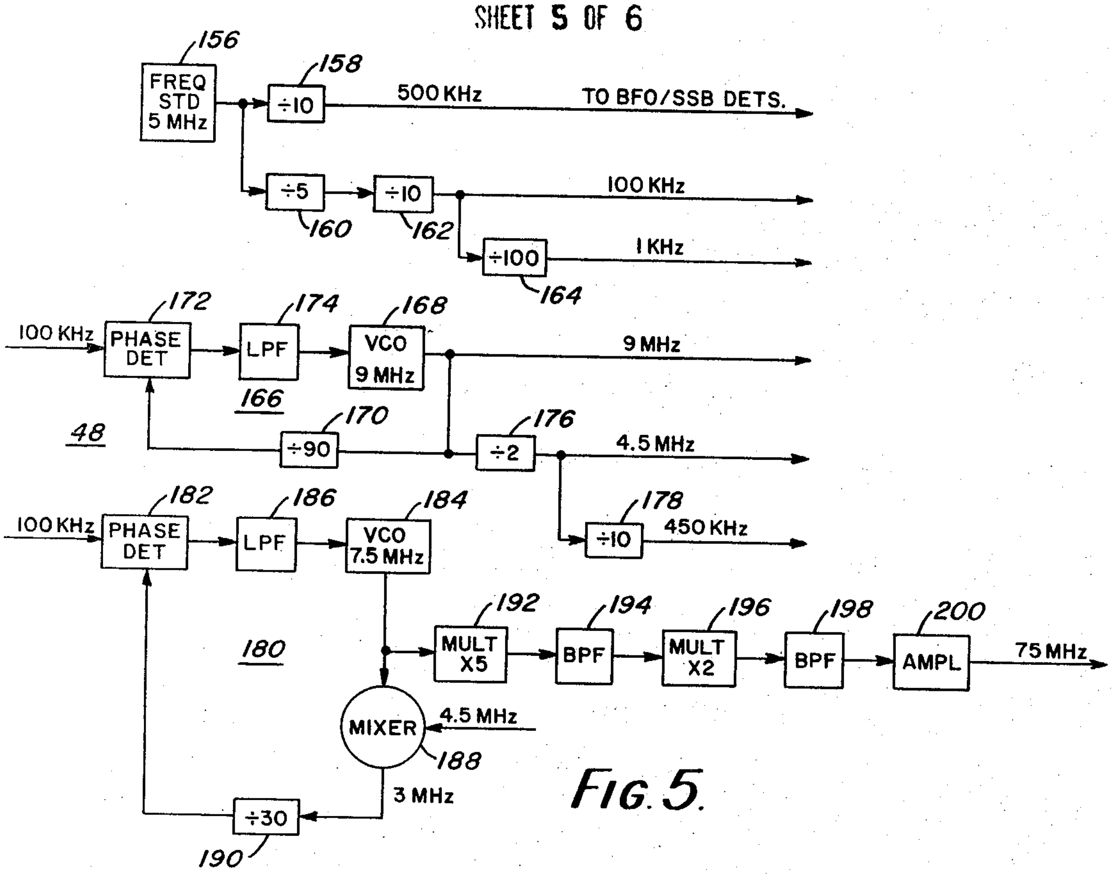
FIG. 5 is a block diagram of the reference frequency generator shown in FIG. 1.

Referring to FIG. 5, a frequency standard 156 which may be a 5 Hz crystal oscillator which may be contained in a temperature controlled oven, is connected to frequency dividers which may be counters. It will be appreciated that pulse shaping circuits may be utilized between sinusoidal signal sources and the dividers in order to provide proper operating pulse levels for the dividers. These pulse shaping circuits are not shown to simplify the illustration. A divider 158 divides the frequency standard signal frequency by 10 to produce a 500 KHz signal which is used in the beat frequency oscillator synthesizer and provides the carrier for reinjection into the single sideband detectors which has the same accuracy as the frequency standard 156. A divider chain consisting of a divide by 5 counter 160 and a divide by 10 counter 162, provides a 100 KHz reference frequency. This 100 KHz reference frequency is applied to a divide by 100 counter 164, to provide the 1 KHz reference frequency.

In order to generate 9 MHz, 4.5 MHz, and 450 KHz reference frequencies, the 100 KHz reference frequency is applied to a phase locked loop 166. This loop includes a voltage controlled oscillator 168 having an output frequency of 9 MHz. This frequency is locked to the 100 KHz reference by dividing the voltage controlled oscillator 168 signal by 90 in a divider 170, and applying the resulting 100 MHz signal to a phase detector 172 which compares the phase of the voltage controlled oscillator output with the 100 KHz reference. An error signal is passed through a low pass filter 174 and used to lock the voltage controlled oscillator 168 to 9 MHz coherent with and to the accuracy of the frequency standard 156. The 9 MHz signal is divided by 2 in a counter 176 to provide the 4.5 MHz reference. The 4.5 MHz reference is divided by 10 in a counter 178 to provide the 450 KHz reference.

The 75 MHz injection to the second mixer 22 (FIG. 1) is provided in the reference frequency generator 48 by a phase locked loop 180. The 100 KHz reference is applied to a phase detector 182 of the loop 180. The output of the phase detector 182 is an error signal which controls a 7.5 MHz voltage control oscillator 184. A low pass filter 186 filters the error signal from the phase detector before application to the voltage controlled oscillator 184. The 4.5 MHz reference frequency is applied to a mixer 188 together with the voltage controlled oscillator 184 output. The mixer 188 serves to subtract the 4.5 MHz from the 7.5 MHz output of the VCO 184 to produce a 3 MHz signal. A counter 190 divides the 3 MHz signal by 30 to produce a 100 KHz signal which is compared with the 100 KHz reference frequency in the phase detector 182. Thus the VCO 184 and the loop is locked when the VCO 184 provides an output frequency of 7.5 MHz coherent with the frequency standard. This signal is multiplied by 5 in a multiplier 192. A bandpass filter 194 assures that only the five times multiplication product is passed to another multiplier 196 which multiplies by 2. This multiplier 196 may be a mixer circuit wherein the same signal is applied to positive mixer product inputs. Thus the mixer multiplies by 2. The mixer circuit of this type is available from the Summit Engineering Corporation, 1820 South 7th Avenue, Bozeman, Mont., their Part Number 760B. The output of the multiplier 196 is again bandpass filtered in a band pass filter 198 and then amplified in an amplifier 200 to produce the 75 MHz injection signal for the second mixer 22.

Figure 6B:
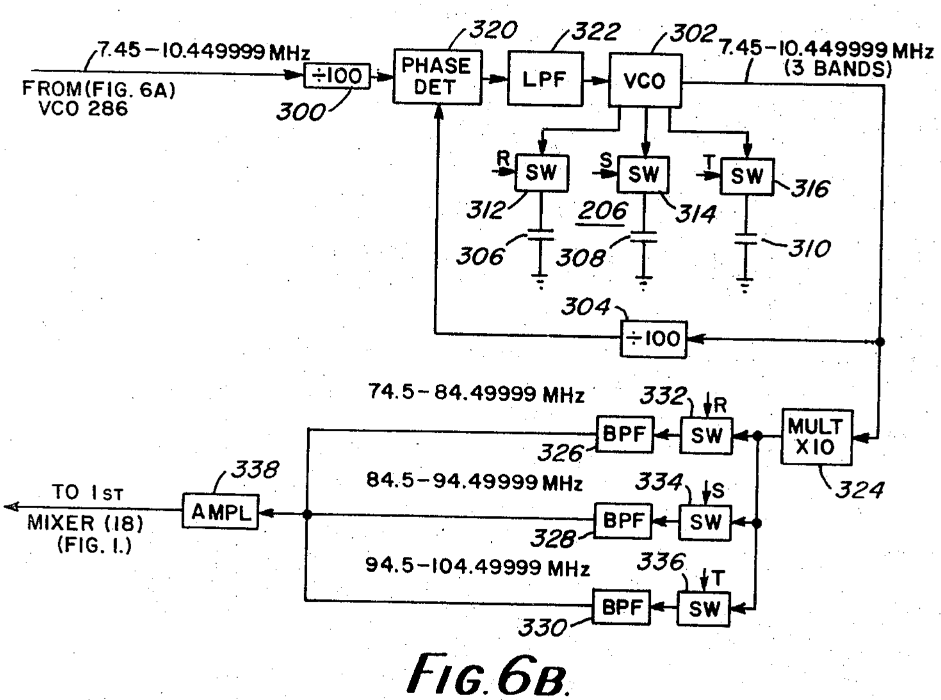
FIGS. 6A and 6B are block diagrams showing the digitally controlled synthesizer used in the receiver system shown in FIG. 1.
Figure 6A:
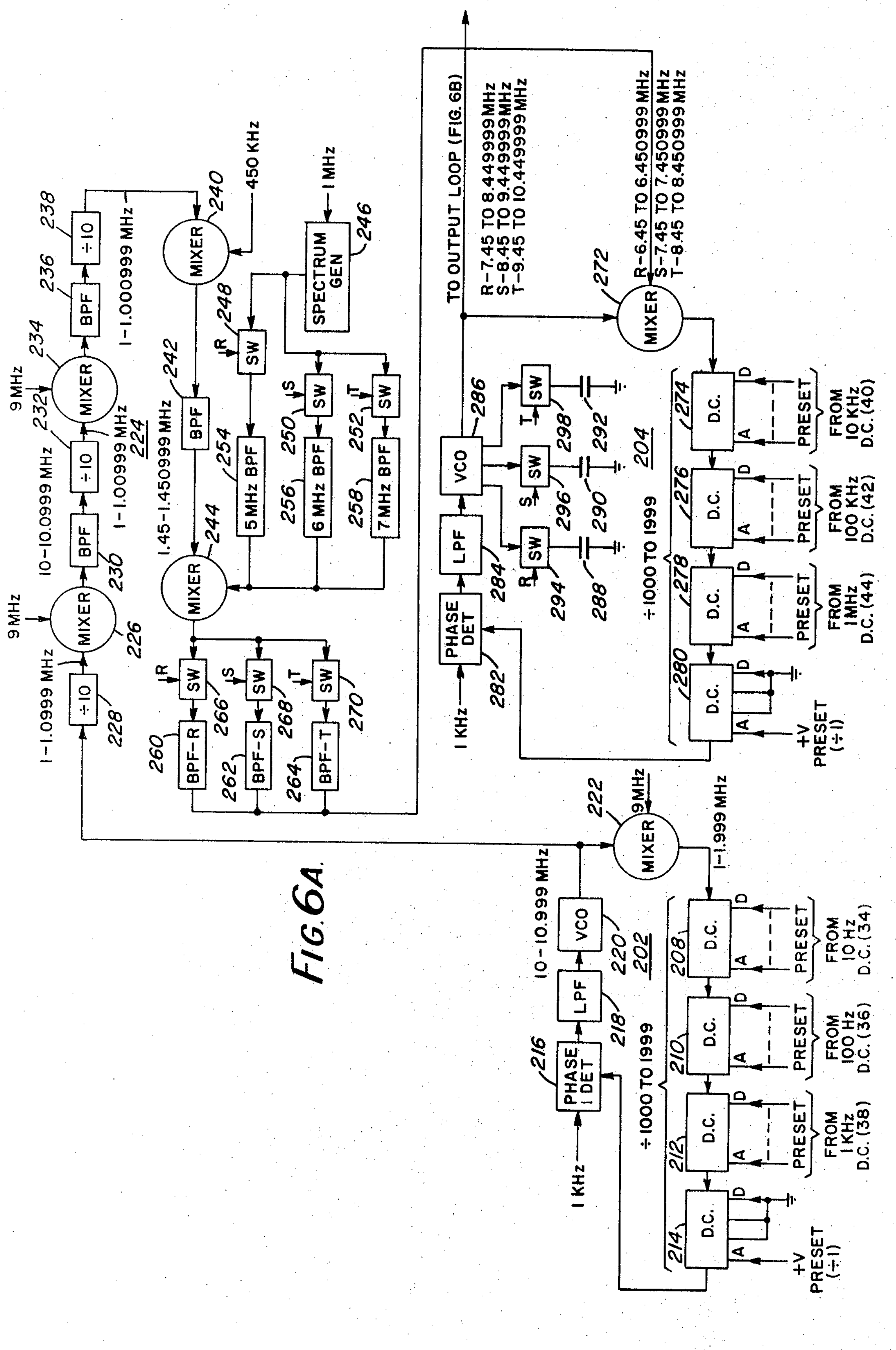

The digitally controlled synthesizer 32 (FIG. 1) is illustrated in FIGS. 6A and 6B. This synthesizer includes a first phase locked loop 202 for synthesizing lower order digits of the frequency, and a second phase locked loop 204 for synthesizing the higher order digit bits of the frequency. An isolation phaselocked loop 206 (FIG. 6B) removes all jitter and spurious components of the signal and provides the injection frequency signal to the first mixer 18, (FIG. 1).

The first phase locked loop 202 includes a chain of decade counters 208, 210, 212 and 214 respectively, for the 10 Hz, 100 Hz and 1 KHz digits of the frequency. The counter 214 is present to divide by 1 so that the entire counter chain consisting of counters 208 to 214 can divide by any number from 1000 to 1999. The output of the counter chain feeds a phase detector 216. A 1 KHz signal which is compared in the detector 216 with a 1 KHz signal from the reference frequency generator 48. The error signal from the phase detector is filtered in a low pass filter 218 and controls a voltage controlled oscillator 220. The output of the oscillator can range from 10 to 10.999 MHz in order to provide frequency in the proper range (1 to 1.999 MHz) which may be divided by the divider chain to produce the 1 KHz reference for the phase detector 216. A mixer, 222, is provided to mix the voltage controller oscillator 220 output with the 9 MHz reference frequency signal. It will be noted that the three lowest order digits of the VCO 220 output correspond to the three lowest order digits stored in the counter stages 34, 36 and 38, since the counters 208, 210 and 212 are preset by the BCD output lines of these counters.

The VCO 220 output is processed in a mixer chain 224 to provide injection frequencies for the second phase locked loop 204. This mixer chain includes a first mixer 226 which mixes the 9 MHz reference frequency with the VCO 220 output which is divided by 10 in a divider 228. The mixer output effectively shifts the three lowest order digits of the output of the VCO 220, one order to the right. The resulting 10 to 10.999 MHz output from the mixer 226 is bandpass filtered in a filter 230, divided by 10 in a counter 232, to now produce frequencies from 1 to 1.00999 MHz. In order words the output frequency from the VCO 220 are shifted to the right, still one additional order or place. Another mixer 234, a bandpass filter 236, and a divide by 10 counter 238 perform functions similar to the mixer 226, the filter 230, and divider 232, and shift the lower order digits still one place further to the right to produce output frequencies from 1 to 1.000999 MHz. This signal is offset by 450 KHz in a mixer 240. A bandpass filter 242 then passes the offset frequency which can range from 1.45 to 1.450999 MHz. This signal is applied to another mixer 244 with one of three reference frequencies, either at 5, 6 or 7 MHz, depending upon the region in the frequency range ( 0 to 30 MHz) of the first mixer injection frequency; 5 MHz corresponding to the first decade (0 to 10 MHz) of the output frequency; 6 MHz corresponding to the second decade of the output frequencies; and 7 MHz corresponding to the third decade of the output frequency. To produce these 5, 6 and 7 MHz selections to the mixer 244, a 1 MHz reference frequency from the reference frequency generator 48 is applied to a spectrum generator 246. This produces a spectrum of frequencies separated by 1 MHz intervals. The highest order digit of the selected frequency which determines the decade, provides switching levels R, S and T, to switching gates 248, 250, and 252 respectively. When the switch 248 is closed the other switches 250 and 252 are open; one switch at a time being open. The switch 248 closed applies the spectrum to a 5 MHz bandpass filter 254 which extracts only the 5 MHz spectrum component and applies it to the mixer. By closing the other switches 250 or 252, the 6 or 7 MHz spectrum component may be selected. The output of the mixer 244 is applied to 3 different bandpass filters 260, 262 and 264, through switches 266, 268 and 270, which are controlled by the R, S and T levels. The bandpass filter 260 is in circuit with the mixer when the 5 MHz bandpass filter 254 is switched in circuit with the mixer 244, and filters the band from 6.45 to 6.450999 MHz. The bandpass filter 262 is in circuit with the mixer 244 when the 6 MHz spectrum component bandpass filter 256 is connected to the mixer 244 input. The bandpass filter 262 selects the frequency range from 7.45 to 7.450999 MHz. The bandpass filter 264 is connected via the switch 270 to the output of the mixer 244 when the 7 MHz spectrum component bandpass filter 258 is connected to the input of the mixer 244. This filter 264 passes the band from 8.45 to 8.450999 MHz. A frequency from 6.45 to 8.450999 MHz is then applied to a mixer 272 in the second phase locked loop 204.

The second phase locked loop 204 includes a chain of decade counters 274, 276, 278 and 280. The counters 274, 276 and 278 are respectively preset by the BCD outputs from the main frequency selection and control counter chain. Specifically, the outputs of the 10 KHz counter 40 are connected to preset the decade counter 274; the outputs of the 100 KHz decade counter 42 are applied to preset the decade counter 276, and the outputs of the 1 MHz decade counter 44 presets the decade counter 278. The counter 280 in the loop 204 is preset to divide by 1. Thus, the counter 274 to 280 divides by any number from 1000 to 1999. The counter chain will provide a 1 KHz frequency which is compared in a phase detector 282 with a 1 KHz reference frequency from the generator 48. The detector output is applied to a low pass filter 284, which applies the error signal from the detector to a voltage controlled oscillator 286. Since the voltage controlled oscillator 286 covers a very wide range of frequency, it is coarse tuned by switching one of three capacitors 288, 290 and 292 into the frequency determining circuits of the oscillator 286. Switches 294, 296 and 298 controlled by the R, S and T levels, select which of the capacitors 288, 290 and 292 is switched in the oscillator 286 circuit. Thus the lower order decade of frequency utilizes the capacitor 288; the next higher order the capacitor 290; and the highest order the capacitor 292. The voltage controlled oscillator thus provides frequencies in any one of three ranges, 7.45 to 8.449999 MHz, 8.45 to 9.449999 MHz, and 9.45 to 10.449999 MHz. Each of these three ranges are identified by the letters R, S and T, so as to correspond to the switching levels R, S and T from the code converter 116 (FIG. 4).

The isolation phase locked loop 206 (FIG. 6B) receives the VCO 286 outputs after they are divided by 100 in a divide by 100 counter 300. A VCO voltage controlled oscillator 302 in the loop 206 which is similar to the VCO 286, has its output divided by 100 in a loop divide by 100 counter 304. It will be noted that the VCO 302 also includes range control capacitors 306, 308 and 310, which are switched in the oscillator 302 circuit by switches 312, 314, and 326 which close when the R, S and T levels are respectively applied thereto. Thus, one of the capacitors is in circuit with the VCO depending upon which of the three decade bands the output injection frequency to the first mixer happens to be. The divider 304 output is compared in a phase detector 320 with the output of the divider 300. A low pass filter 322 applies the error signal to control and lock the VCO 302 to the same frequency as the VCO 286. The output loop 206 provides isolation which may be desirable to supress any spurious frequency components and any jitter or transients in the operation of the other loops and switches in the digitally controlled synthesizer.

The output of the loop 206 is multiplied by 10 in a multiplier 324 so as to raise the VCO 302 output frequencies into the range from 74.5 to 10.449999 MHz which is the range of injection frequencies to the first mixer 18. The three bandpass filters 326, 328 and 330, which are respectively switched in circuit with the output of the multiplier 324 to switches 332, 334 and 336, are utilized. These switches are respectively controlled by the R, S and T levels from the code converter 116 (FIG. 4). The output of the selected bandpass filter 326 to 330 is then amplified in an amplifier 338 and applied as the injection signal to the first mixer 18. Accordingly, the frequency locked to the accuracy of the standard 156 and controlled and determined by the count set into the main chain of counters 34 to 46 is provided as the first injection frequency. The radio receiver is therefore tuned to the frequency set into the counter either by the data processing unit 62 or the tuning controls 64 and 66 to the operation of the pulses generators 72, 86, and the tuning speed control 74.

The beat frequency synthesizer 50 may be a phase locked loop synthesizer similar to one of the loops 202 of the digitally controlled synthesizer 32. This loop may include a mixer either internally or externally of the loop so that the output frequency which is injected as the BFO injection into the IF amplifiers and detectors 26 (FIG. 1) may vary from 490 KHz to 509.99KHz.

From the foregoing description, it will be apparent that there has been provided an improved tuning network which may be tuned very rapidly either manually or by external digital control, as from a computer. The system provided by the invention may be used as a digital synthesizer when frequency generation or signal generation alone is required, as in test equipment, and other instrumentation applications, or in a radio system as illustrated by the receiver system described above. Variations and modifications in the herein described system, within the scope of the invention, will undoubtedly suggest themselves to those skilled in the art. Accordingly, the foregoing description should be taken merely as illustrative and not in any limiting sense.

What is claimed is:

1. A radio system for handling signals having any frequency contained in a band of frequencies, said system comprising a. means for tuning said system to any said frequency over said band, b. means for controlling said tuning means including i. a plurality of counters connected in cascade to each other, ii. means for entering counts selectively into the inputs of different ones of said counters, and c. means coupled to said tuning means for utilizing the signals of the frequency to which said system is tuned by said tuning means.

2. The invention as set forth in claim 1 wherein said controlling means further includes means responsive to changes in said frequency for operating said entering means to enter said counts into other than the first of said cascade connected counters.

3. The invention as set forth in claim 2 wherein said change responsive means includes means responsive to the rate of said changes in said frequency for operating said entering means to enter said counts into the second and third of said counters in sequence corresponding to the magnitude of said rate of change.

4. The invention as set forth in claim 3 wherein said entering means comprises means for generating a train of electrical pulses corresponding to the change in said frequency, and means for applying said pulses to the first of said counters.

5. The invention as set forth in claim 4 wherein said generating means comprises an electro-optical means including a light source, and manually operable means for interrupting the light from said source to produce said pulses.

6. The invention as set forth in claim 5 wherein said manually operable means comprises a member having alternate transparent and opaque regions, said member being disposed in the path of the light from said source, manually operable means for moving said member to interrupt said light, and an electro-optical transducer in the path of said interrupted light.

7. The invention as set forth in claim 5 including means coupled to said counters for displaying numerals representing the numbers corresponding to said frequency as stored therein while said manually operable means are operated whereby to indicate the frequency to which said system is tuned.

8. The invention as set forth in claim 5 wherein each of said counters includes means for counting in opposite senses, and said manually operable means includes means for interrupting said light from said source to provide said pulses on different output lines in accordance with the direction of operation of said manual operation, and means for applying said pulses from said different lines to the first of said counters whereby to cause said counters to count in opposite senses depending upon the one of said lines on which said pulses are provided.

9. The invention as set forth in claim 8 wherein said manually operable means includes a member having a pair of tracks including alternate opaque and transparent sections, the like sections on different ones of said tracks being offset from each other by a distance equal to less than the length thereof, a source of light and a pair of electro-optical transducers on opposite sides of said member, each transducer being in the path of the light from said source which extends through a different one of said tracks, a shaft coupled to said member for moving said member in opposite directions, and circuit means coupled to said transducers for providing said pulses on different said lines depending upon the direction of rotation of said shaft.

10. The invention as set forth in claim 4 including means responsive to the rate of change of said frequency for applying said pulses to one of said counters subsequent to said first counter.

11. The invention as set forth in claim 4 including means responsive to the rate of change of said frequency for applying said pulses to at least one of a plurality of said counters subsequent to said first counter, the spacing of said one counter from said first counter depending upon the magnitude of said rate of change.

12. The invention as set forth in claim 11 wherein said pulse generating means comprises a manually operable electro-optical transducer.

13. The invention as set forth in claim 12 including a plurality of said pulse generating means for generating separate trains of said pulses respectively at different pulse repetition rates for like speed of manual operation, means for applying said train having the higher pulse repetition rate to enter counts in said first counter and to said rate of change responsive means, and means for applying said train having the lower repetition rate to enter counts into one of said counters at the end of the chain of said cascade connected counters near the end of said chain opposite from said first counter.

14. The invention as set forth in claim 11 wherein said rate responsive means includes frequency detector means connected to said pulse generating means for providing a plurality of outputs each after the repetition rate of said pulses exceeds a successively higher rate, and a plurality of switch means each separately operated by different ones of said outputs for applying said pulses to different ones of said plurality of subsequent counters.

15. The invention as set forth in claim 14 wherein said frequency detector comprises a plurality of integrators, a plurality of Schmitt trigger circuits coupled separately to said integrators and adapted to be triggered when the level of the integrated pulses exceeds a certain threshold, said Schmitt triggers provided said switch operating outputs.

16. The invention as set forth in claim 11 wherein said counters each correspond to a different digit of said frequency of said signals in said band, said first counter corresponding to the lowest order digit.

17. The invention as set forth in claim 16 wherein said counters are decade counters.

18. The invention as set forth in claim 17 including a numeric readout display for each of said digits of said frequency, and a plurality of code converter means for applying the count from each counter separately to the numeric display for the digit corresponding thereto.

19. The invention as set forth in claim 16 wherein said tuning means includes a digitally controlled frequency synthesizer connected to said counters.

20. The invention as set forth in claim 19 wherein said digitally controlled synthesizer includes a plurality of counters each corresponding to a different one of said counters in said controlling means, and means for transferring the counts in said controlling means counters to said synthesizer counters corresponding thereto.

21. The invention as set forth in claim 20 wherein said tuning means includes a frequency translating means, means for applying the output of said synthesizer to said translating means, said translating means having an intermediate frequency signal terminal and also having a terminal for said signals to be handled by said system, and means for applying one of said intermediate frequency signals and said signal to be handled at the frequency to which said system is tuned to the one of the terminals therefor and deriving the other of said intermediate frequency signals and said signal to be handled to the other of said terminals therefor.

22. The invention as set forth in claim 21 wherein said tuning means further comprises a plurality of circuits each tuned to transmit said signals to be handled which lie in a different portion of said band, and means responsive to the count stored in a plurality of said counters for selectively connecting different ones of said circuits to said translating means terminal for said signal to be handled when the count in said counters and the portion of said band which said different circuits are tuned correspond to each other.

23. The invention as set forth in claim 22 including means responsive to digital input data corresponding to said frequency to which said system is to be tuned for converting said input data into a plurality of digital words each corresponding to a different digit of said frequency, and addressing means for applying said words separately to the counters for the digits to which each of said word corresponds and presetting counters to the value of said words.

24. The invention as set forth in claim 21 wherein said radio system is operative to receive signals, means for applying said received signals, as the signal to be handled, to said one terminal of said translating means and deriving said intermediate frequency signal from said other terminal, means responsive to said intermediate frequency signal for detecting the information in said received signals, a second plurality of counters connected in cascade, a second mutually operated pulse generating means for applying pulses to the input of the first of said second plurality of counters, and means responsive to the count contained in said second counters for generating a second signal having a frequency at least the lower order digits of which correspond to the digits of the count in said second counters, and means for injecting said second signal into said detecting means to beat with said intermediate frequency responsive signal therein for detecting any single sideband and CW signal components of said received signals.

25. The invention as set forth in claim 24 further comprising means responsive to the rate of said pulses from said second pulse generating means for applying said last named pulses to a counter of said second plurality of counters subsequent to the first counter of said second plurality of counters.

26. The invention as set forth in claim 25 including readout means for displaying the digits of the count stored in said first plurality of counters, and means for selectively applying the counts stored in said second plurality of counters to those said readout means which display like digits of the frequency of said received signal and said second signal.

27. A frequency synthesizer for generating an output signal, having a frequency within a band of frequencies, from a reference frequency signal, said synthesizer comprising a plurality of counters, each corresponding to a different digit of a multi-digit number representing the frequencies in said band, said counters being connected to each other in cascade in the order of the digits in which they correspond, means for applying pulses to the one of said counters for the lowest order digit of said frequency for setting said counters to a count corresponding to the frequency of the signal to be generated, means responsive to said reference frequency signal and the count of each said counters for translating said signal into a signal having a frequency, the value of each digit of which corresponds to the value of the count in the counter corresponding thereto, said translated signal providing said generated signal, a manual frequency selection control, said pulse applying means comprises means for generating said pulses when and only when said frequency selection control is operated, and means responsive to the rate of change of the repetition rate of said pulses for applying said pulses to an input of said counters corresponding to digits of said code of higher order than said lowest order digit.

28. The invention as set forth in claim 27 wherein said means responsive to said pulse repetition rate of change includes switching means operative to apply said pulses to successively higher order digit corresponding counters as said pulse repetition rate exceeds successively higher magnitudes.

29. The invention as set forth in claim 28 wherein said manual frequency selection control includes a knob which rotates a shaft and said pulse generating means includes an opto-electric transducer having a light interrupter operated upon rotation of said shaft, and means for generating said pulses on different ones of a pair of lines depending upon the direction or rotation of said shaft, and wherein said counters are each up-down counters, said lines being connected respectively to the up and down inputs of said lowest order digit corresponding counter.

30. The invention as set forth in claim 29 including a numeric readout means for displaying visually each digit of said frequency, and means for inputting said counter counts to said display means for providing said display while said control is operated.

31. The invention as set forth in claim 27 wherein said translating means includes a plurality of phase locked loops each including a separate chain of a plurality of cascade counters, and means connecting said first named counter separately to different ones of said first named counters, for presetting different ones of said phase locked loop counters to the counts stored in said first named counter, and means responsive to the output signals from said loop for providing said synthesizer output signal.

32. In a tuning system, the combination comprising a counter having a plurality of stages each corresponding to a successively higher digit of a frequency representing number, means for generating a train of pulses while tuning, means for applying said pulses to the inputs of successive ones of said counters depending upon the repetition rate of said pulses, and a digitally controlled tuning network, and means for coupling said counters to said network for controlling the tuning thereof.

* * * * *